US010095905B2

(12) United States Patent
Ye et al.

(10) Patent No.: US 10,095,905 B2
(45) Date of Patent: Oct. 9, 2018

(54) FINGERPRINT IDENTIFICATION DEVICE, DRIVING METHOD THEREOF, DISPLAY PANEL AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Benyin Ye, Beijing (CN); Zhidong Wang, Beijing (CN); Xiaomei Huang, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 126 days.

(21) Appl. No.: 15/204,489

(22) Filed: Jul. 7, 2016

(65) Prior Publication Data
US 2017/0193266 A1 Jul. 6, 2017

(30) Foreign Application Priority Data
Jan. 5, 2016 (CN) .......................... 2016 1 0007045

(51) Int. Cl.
*G06K 9/00* (2006.01)
*G01R 27/26* (2006.01)
*H01L 27/12* (2006.01)

(52) U.S. Cl.
CPC ..... *G06K 9/00006* (2013.01); *G01R 27/2605* (2013.01); *G06K 9/0002* (2013.01); *H01L 27/124* (2013.01)

(58) Field of Classification Search
CPC ............ G06K 9/0002; G06K 9/00006; G01R 27/2605; H01L 27/124
(Continued)

(56) References Cited

U.S. PATENT DOCUMENTS

| 7,418,117 B2 * | 8/2008 | Kim ..................... G02F 1/13338 340/5.53 |
| 8,669,843 B2 * | 3/2014 | Chen ..................... G06K 9/0002 340/5.53 |

(Continued)

FOREIGN PATENT DOCUMENTS

| CN | 101727571 | 6/2010 |
| CN | 105159506 | 12/2015 |

OTHER PUBLICATIONS

"First office action," CN Application No. 201610007045.0 (dated Aug. 6, 2018).

*Primary Examiner* — Daniel Mariam
(74) *Attorney, Agent, or Firm* — Womble Bond Dickinson (US) LLP

(57) ABSTRACT

The present application discloses a fingerprint identification device, a driving method thereof, a display panel and a display apparatus. The fingerprint identification device comprises a plurality of fingerprint identification units arranged in a matrix, a signal input line for loading a detection signal and a signal reading line for reading an identification signal which are in one-to-one correspondence with each column of fingerprint identification units. Each fingerprint identification unit comprises a fingerprint identification electrode, a first switch unit and a second switch unit connected to the signal input line respectively. The first switch unit is used for controlling an electrical conduction between the fingerprint identification electrode and the signal input line, the second switch unit is used for controlling an electrical conduction
(Continued)

between the fingerprint identification electrode and the signal reading line.

16 Claims, 8 Drawing Sheets

(58) Field of Classification Search
   USPC .......................................................... 382/124
   See application file for complete search history.

(56) References Cited

U.S. PATENT DOCUMENTS 9,767,339 B1 * 9/2017 He ..................... G06K 9/00087
2011/0273267 A1   11/2011 Bong

* cited by examiner

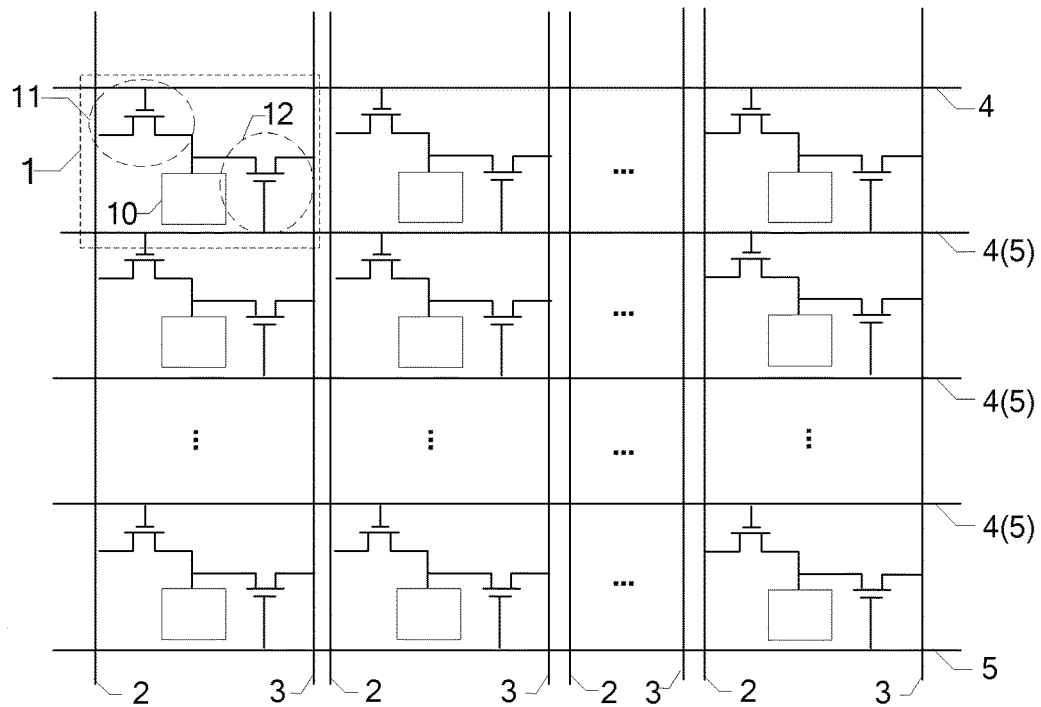

Fig. 4

| controlling a first switch unit in each row of fingerprint identification units of the fingerprint identification device to be turned on sequentially row by row, so as to control the fingerprint identification electrodes in each row of fingerprint identification units to be electrically connected with the signal input line and load a detection signal transmitted by the signal input line to the fingerprint identification electrode | S501 |
|---|---|

| controlling a second switch unit in each row of fingerprint identification units of the fingerprint identification device to be turned on sequentially row by row, so as to control the fingerprint identification electrodes in each row of fingerprint identification units to be electrically connected with the signal reading line, read and output an identification signal generated by the fingerprint identification electrode by means of the signal reading line | S502 |
|---|---|

Fig. 5 ary between the detection signals and the identification signals, (d) finally, scanning signals are applied sequentially to the gate lines $G_2, G_3 \ldots G_n$, and the above steps (a)-(c) are repeated until the end of scanning. It can be seen from the above process that, the data line 03 are reused for two functions, i.e., one is writing in detection signals at the writing-in stage, and the other is reading identification signals at the reading stage. Moreover, it is required to perform both the writing-in and reading for each row before executing the step of applying a scanning signal to the gate line of a next row. Thus it can be seen that the scanning will cost a longer time, the frequency of scanning is hard to increase, and the accuracy of identification is decreased accordingly.

Therefore, how to reduce the scanning time, increase the scanning frequency, and improve the identification accuracy is a technical problem to be urgently solved by those skilled in the art.

FINGERPRINT IDENTIFICATION DEVICE, DRIVING METHOD THEREOF, DISPLAY PANEL AND DISPLAY APPARATUS

RELATED APPLICATION

The present application claims the benefit of Chinese Patent Application No. 201610007045.0, filed on Jan. 5, 2016, the entire disclosure of which is incorporated herein by reference.

TECHNICAL FIELD

The invention relates to the field of display technology, in particular, to a fingerprint identification device, a driving method thereof, a display panel and a display apparatus.

BACKGROUND

The fingerprint texture for human's finger has two types of patterns: ridges and valleys. Since fingerprints vary from person to person, by verifying a person's fingerprint, his/her identity can be verified. In order to enhance the safety for operating a display apparatus, a fingerprint identification device can be arranged on the display apparatus, with which when operating some programs installed on the display apparatus requiring confidentiality, the operator is required to verify his/her fingerprint, and if the operator's fingerprint is not successfully verified, it proves that the operator has no right to run the programs.

At present, as shown in FIG. 1, a fingerprint identification device is generally composed of gate lines 02 in a row direction, data lines 03 in a column direction, a fingerprint identification electrode 01 and a thin-film transistor (TFT) 04. The gate lines 02 comprise gate lines $G_1, G_2 \ldots G_n$, and the data lines 03 comprise data lines $X_1, X_2 \ldots X_n$. The fingerprint identification electrode 01 has a self-capacitance function, and when a person's fingerprint touches the fingerprint identification electrode, it causes a change in the self-capacitance of the fingerprint identification electrode, such that an output signal on the data line is changed, hence the fingerprint pattern can be determined by means of an variation of the output signal. The specific operation process of the fingerprint identification device is described as follows: (a) detection signal writing-in stage: as shown in FIG. 2a, a scanning signal is applied to the gate line $G_1$ to switch on a first row of TFTs, meanwhile, detection signals $D_1, D_2 \ldots D_n$ are written in through the data line 03. The area where the fingerprint identification electrode 01 is located generates a corresponding capacitance due to capacitance coupling. The capacitance would not be changed without an external influence, but when a person's finger touches the fingerprint identification device, since the fingerprint texture features the two patterns of ridges and valleys, and the distances from a ridge and from a valley to the fingerprint identification electrode are different, this would cause different influences on the capacitances generated at the fingerprint identification electrode corresponding to the positions of the ridge and the valley, resulting in different capacitance changes, (b) identification signal reading stage: as shown in FIG. 2b, identification signals $D_1', D_2' \ldots D_n'$ that experience a change induced by the fingerprint texture are read, and sent to a processing chip through the data line 03, (c) comparison process: the processing chip compares the detection signals with the identification signals, so as to determine the ridges/valleys to which each fingerprint identification electrode unit corresponds based on an amount of

SUMMARY

In view of this, embodiments of the invention provide a fingerprint identification device, a driving method for the fingerprint identification device, a display panel and a display apparatus, which can reduce the scanning time, increase the scanning frequency, and improve the identification accuracy.

An embodiment of the invention provides a fingerprint identification device, which may comprise a plurality of fingerprint identification units arranged in a matrix, a signal input line for loading a detection signal and a signal reading line for reading an identification signal which are in one-to-one correspondence with each column of fingerprint identification units. Each fingerprint identification unit comprises a fingerprint identification electrode, a first switch unit and a second switch unit, the first switch unit is connected to the fingerprint identification electrode and the signal input line respectively for controlling an electrical conduction between the fingerprint identification electrode and the signal input line, the second switch unit is connected to the fingerprint identification electrode and the signal reading line respectively for controlling an electrical conduction between the fingerprint identification electrode and the signal reading line.

In some embodiments, the fingerprint identification device further comprises a first gate line connected to the first switch units in each row of fingerprint identification units, and a second gate line connected to the second switch units in each row of fingerprint identification units.

In some embodiments, for adjacent two rows of fingerprint identification units, the second gate line connected to the second switch units in a preceding row of fingerprint identification units and the first gate line connected to the first switch units in a following row of fingerprint identification units are located between the adjacent two rows of fingerprint identification units.

In some embodiments, for adjacent two rows of fingerprint identification units, the second gate line connected to the second switch units in the preceding row of fingerprint identification units and the first gate line connected to the first switch units in the following row of fingerprint identification units are a same gate line.

In some embodiments, the first switch unit comprises a first thin film transistor, the second switch unit comprises a second thin film transistor, a first terminal of the first thin film transistor is connected to the signal input line, a second terminal of the first thin film transistor is connected to the fingerprint identification electrode, and a gate of the first thin film transistor is connected to the first gate line. A first terminal of the second thin film transistor is connected to the fingerprint identification electrode, a second terminal of the second thin film transistor is connected to the signal reading line, and a gate of the second thin film transistor is connected to the second gate line.

In some embodiments, the signal input line and signal reading line are located at two sides of each column of fingerprint identification units, respectively.

In some embodiments, the fingerprint identification device further comprises a silicon wafer as a substrate.

Another embodiment of the invention provides a display panel which may comprise a substrate and a fingerprint identification device located on the substrate as provided by any of the above embodiments.

A further embodiment of the invention provides a display apparatus which may comprise a fingerprint identification device provided by any embodiment in the above embodiments or a display panel provided by the embodiment of the invention.

A further embodiment of the invention also provides a driving method for a fingerprint identification device, the method may comprise:

controlling a first switch unit in each row of fingerprint identification units of the fingerprint identification device to be turned on sequentially row by row, so as to control a fingerprint identification electrode in each row of fingerprint identification units to be electrically connected with a signal input line and load a detection signal transmitted by the signal input line to the fingerprint identification electrode; and controlling a second switch unit in each row of fingerprint identification units of the fingerprint identification device to be turned on sequentially row by row, so as to control the fingerprint identification electrodes in each row of fingerprint identification units to be electrically connected with a signal reading line, read and output an identification signal generated by the fingerprint identification electrode by means of the signal reading line.

In some embodiments, the method further comprises controlling the second switch unit in each row of fingerprint identification units to be turned on, in the meantime controlling the first switch unit in an adjacent next row of fingerprint identification units to be turned on.

In some embodiments, the step of controlling the second switch unit in each row of fingerprint identification units to be turned on, in the meantime controlling the first switch unit in an adjacent next row of fingerprint identification units to be turned on comprises controlling the second switch unit in each row of fingerprint identification units and the first switch unit in the adjacent next row of fingerprint identification units to be turned on simultaneously by means of a same gate line between adjacent two rows of fingerprint identification units.

The embodiments of the invention provide a fingerprint identification device, a driving method thereof, a display panel and a display apparatus. The fingerprint identification device may comprise a plurality of fingerprint identification units arranged in a matrix, a signal input line for loading a detection signal and a signal reading line for reading an identification signal which are in one-to-one correspondence with each column of fingerprint identification units. Each fingerprint identification unit comprises a fingerprint identification electrode, a first switch unit and a second switch unit. The first switch unit is connected to the fingerprint identification electrode and the signal input line respectively, for controlling an electrical conduction between the fingerprint identification electrode and the signal input line. The second switch unit is connected to the fingerprint identification electrode and the signal reading line respectively, for controlling an electrical conduction between the fingerprint identification electrode and the signal reading line. Since the fingerprint identification device is provided with the signal input line, the signal reading line and two independent switch units in each fingerprint identification unit, it may be enabled that, by means of the first switch unit and the second switch unit, controlling the fingerprint identification units to read the identification signal sequentially row by row at the same time of loading the detection signal sequentially row by row for the fingerprint identification units. Thus, the scanning time may be reduced, the scanning efficiency may be increased and the accuracy of identification may be improved.

BRIEF DESCRIPTION OF THE DRAWINGS

FIG. 4 is a schematic diagram of the structure of a fingerprint identification device according to another embodiment of the invention;

FIG. 5 is a flow chart of a driving method for a fingerprint identification device provided by a further embodiment of the invention;

EMBODIMENTS OF THE INVENTION

Next, the specific implementation of the fingerprint identification device, driving method thereof, display panel and display apparatus provided by embodiments of the invention will be described in detail with reference to the accompanying drawings.

The first and second terminals of a thin film transistor mentioned in the embodiments of the invention are symmetrical, hence the first terminal and the second terminal are interchangeable. For the embodiments of the invention, in order to distinguish between the two terminals other than the gate of the thin film transistor, one of the terminals is referred to as the first terminal and the other is referred to as the second terminal.

It should be understood that, when element A is "connected to" element B, it may mean A is directly connected to B, or there may be an element between A and B (i.e., A is connected to B indirectly, e.g., A is connected to B via C). In contrast, when element A is said to be "directly" connected to B, it means that no element exists between A and B.

Figure 1:
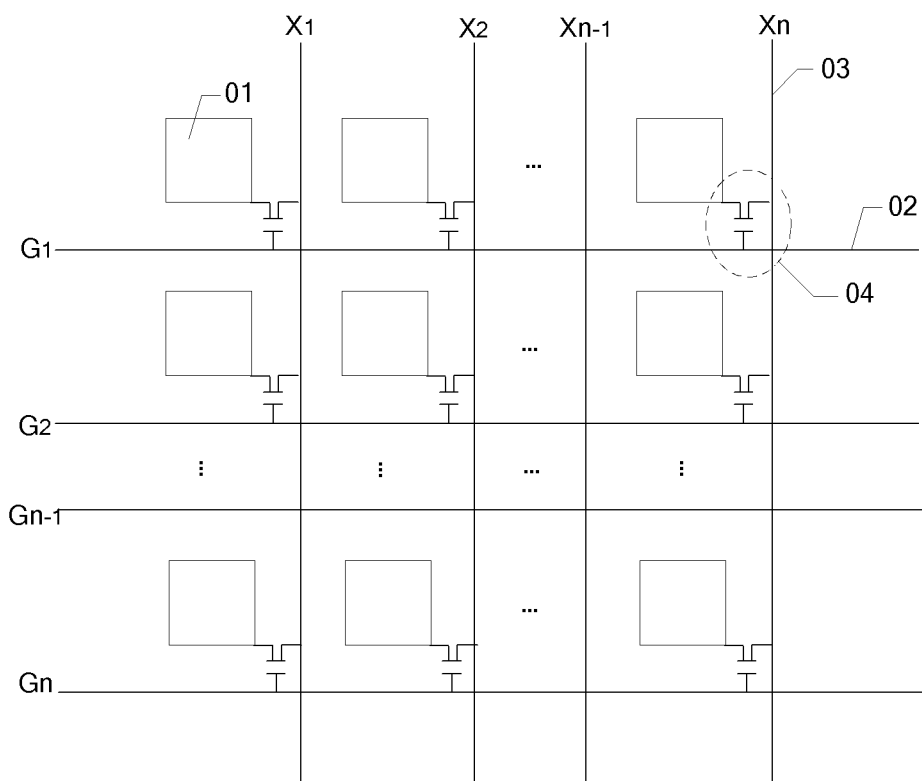
FIG. 1 is a schematic diagram of the structure of a fingerprint identification device in the prior art.
Figure 2A:
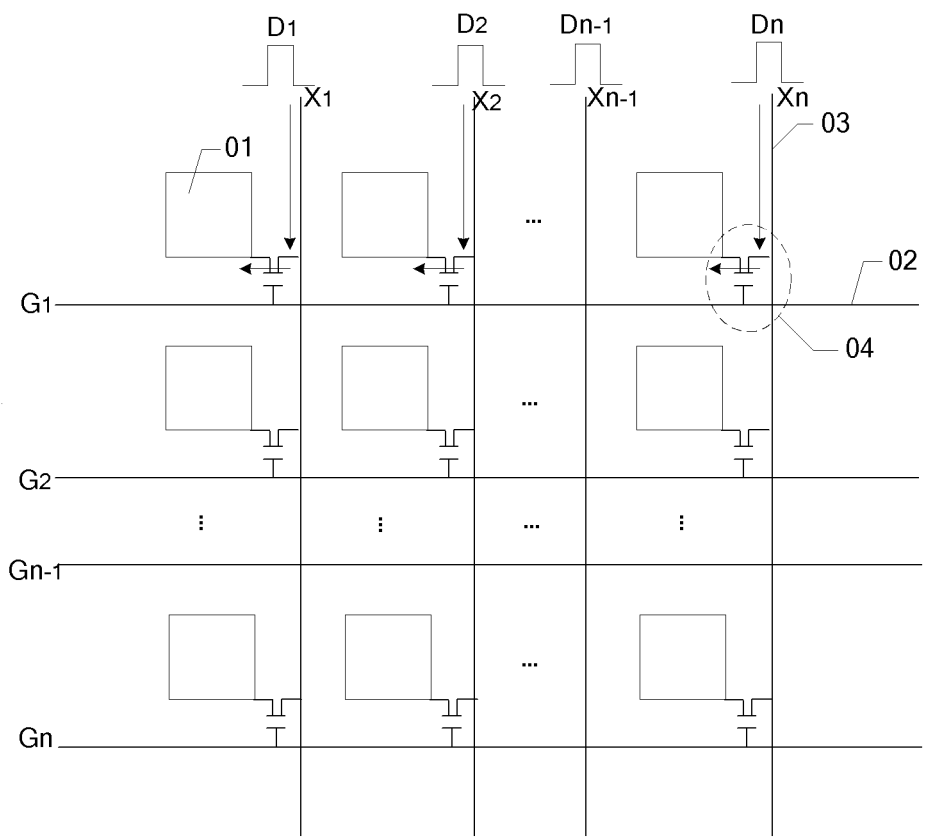
FIG. 2a and FIG. 2b respectively illustrate different operation stages for the fingerprint identification device in the prior art.
Figure 2B:
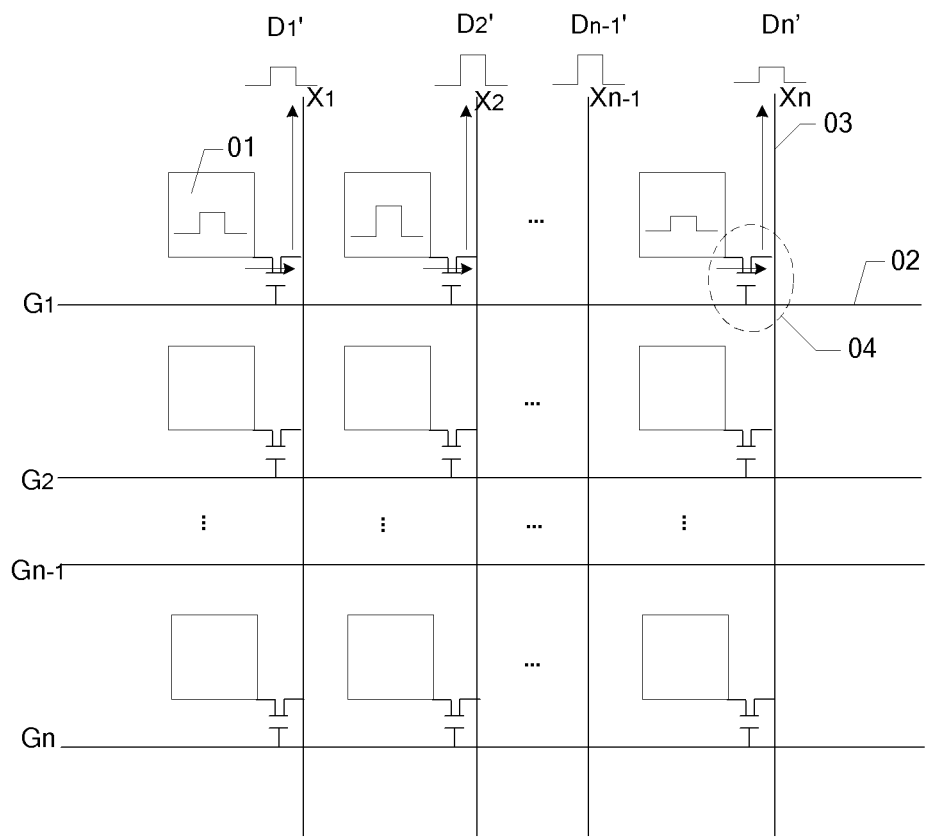
Figure 3:
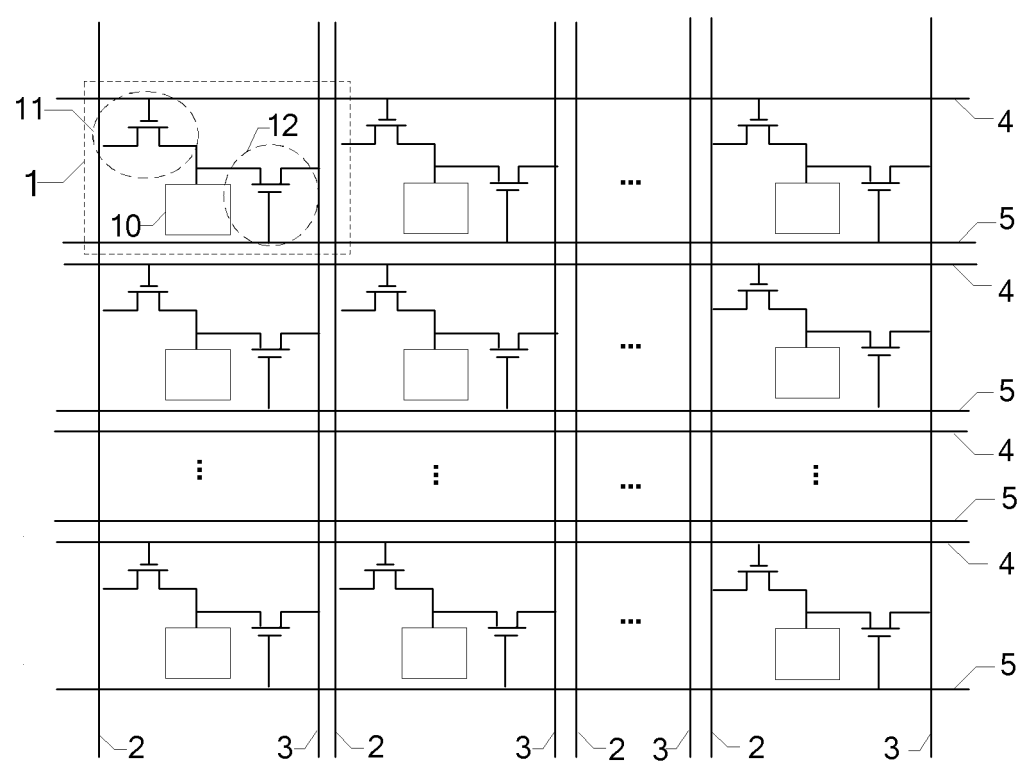
FIG. 3 is a schematic diagram of the structure of a fingerprint identification device according to an embodiment of the invention.

As shown in FIG. 3 and FIG. 4, an embodiment of the invention provides a fingerprint identification device. The fingerprint identification device may comprise a plurality of fingerprint identification units 1 arranged in a matrix, a signal input line 2 for loading a detection signal and a signal reading line 3 for reading an identification signal which are in one-to-one correspondence with each column of fingerprint identification units 1. Each fingerprint identification unit 1 comprises a fingerprint identification electrode 10, a first switch unit 11 and a second switch unit 12. The first switch unit 11 is connected to the fingerprint identification electrode 10 and the signal input line 2 respectively, for controlling an electrical conduction between the fingerprint identification electrode 10 and the signal input line 2. The second switch unit 12 is connected to the fingerprint identification electrode 10 and the signal reading line 3 respectively, for controlling an electrical conduction between the fingerprint identification electrode 10 and the signal reading line 3.

In this embodiment, when the fingerprint identification electrode 10 is electrically connected with the signal input line 2, the signal input line 2 may load a detection signal to the fingerprint identification electrode 10, and when the fingerprint identification electrode 10 is electrically connected with the signal reading line 3, the signal reading line 3 may read an identification signal generated by the fingerprint identification electrode 10 and transmit the identification signal to a processing chip of the fingerprint identification device for processing.

For the fingerprint identification device provided by this embodiment of the invention, since it is provided with the signal input line, the signal reading line and two independent switch units in each fingerprint identification unit, it may be enabled that, by means of the first switch unit and the second switch unit, controlling the fingerprint identification units to read the identification signal sequentially row by row at the same time of loading the detection signal sequentially row by row for the fingerprint identification units. Thus, the scanning time may be reduced, the scanning efficiency may be increased and the accuracy of identification may be improved.

In an embodiment of the invention, as shown in FIG. 3 and FIG. 4, the fingerprint identification device may further comprise a first gate line 4 connected to the first switch units 11 in each row of fingerprint identification units 1, and a second gate line 5 connected to the second switch units 12 in each row of fingerprint identification units. In this way, the first switch unit and the second switch unit can be controlled respectively by different gate lines, and it may be realized that, efficiently controlling the fingerprint identification units to read the identification signals sequentially row by row at the same time of controlling the fingerprint identification units to load the detection signals sequentially row by row. Thus, it may further reduce the scanning time and improve the accuracy of identification.

In the fingerprint identification device provided by the embodiment of the invention, in order to reduce the influence on the aperture ratio, as shown in FIG. 3 and FIG. 4, for adjacent two rows of fingerprint identification units, a second gate line 5 connected to the second switch units 12 in a preceding row of fingerprint identification units and a first gate line 4 connected to the first switch units 11 in a following row of fingerprint identification units may be located between the adjacent two rows of fingerprint identification units. In this way, the first gate line and the second gate line located at the gap between the adjacent two rows of fingerprint identification units can control simultaneously the second switch units in the preceding row of fingerprint identification units and the first switch units in the following row of fingerprint identification units, so as to reduce the scanning time and increase the scanning frequency, which may in turn improve the accuracy of identification. Moreover, the influence on the aperture ratio may be reduced.

Further, in another embodiment of the invention, as shown in FIG. 4, in order to simplify the wiring process, for adjacent two rows of fingerprint identification units, the second gate line connected to the second switch units in a preceding row of fingerprint identification units and the first gate line connected to the first switch units in the following row of fingerprint identification units may be a same gate line. In this embodiment, for a fingerprint identification device comprising N rows of fingerprint identification units, the fingerprint identification device comprises N+1 gate lines, among which the first gate line is connected to the first switch units in the first row of fingerprint identification units, the (N+1)th gate line is connected to the second switch units in the Nth row of fingerprint identification units, and the nth gate line is connected to the second switch units in the (n−1)th row of fingerprint identification units and the first switch units in the nth row of fingerprint identification units, n and N are positive integers, and 1<n<N. In this way, the second switch units in the preceding row of fingerprint identification units and the first switch units in the following row of fingerprint identification units can be controlled simultaneously just by one gate line located at the gap between the adjacent two rows of fingerprint identification units, thus the space may be saved, the process may be simplified and the scanning frequency may be increased.

In the fingerprint identification device provided by an embodiment of the invention, as shown in FIG. 3 and FIG. 4, the first switch unit 11 may comprise a first thin film transistor; the second switch unit 12 may comprise a second thin film transistor. Specifically, a first terminal of the first thin film transistor may be connected to the signal input line 2, a second terminal may be connected to the fingerprint identification electrode 10, and a gate may be connected to the first gate line 4. A first terminal of the second thin film transistor may be connected to the fingerprint identification electrode 10, a second terminal may be connected to the identification signal reading line 3, and a gate may be connected to the second gate line 5. It should be noted that a type of the switch element included in the first switch unit or the second switch unit may be determined based on practical circumstances, which will not be defined herein.

In the fingerprint identification device provided by an embodiment of the invention, as shown in FIG. 3 and FIG. 4, the signal input line 2 and the signal reading line 3 may be located at two sides of each column of fingerprint identification units 1 respectively, that is to say, there are one signal input line and one signal reading line between adjacent two columns of fingerprint identification units. The signal input line and the signal reading line may be arranged at the same layer. In this way, influence on the aperture ratio can be reduced, and it is favorable to simplification of process.

Based on the same inventive concept, a further embodiment of the invention provides a display panel, which may comprise a fingerprint identification device as described in any embodiment of the above embodiments of the invention. A substrate of the display panel such as a glass substrate or a resin substrate may serve as the substrate of the aforesaid fingerprint identification device.

In other embodiments, the fingerprint identification device may not be integrated in the display panel, but being a separate fingerprint identification device, in this case, a silicon wafer may be used as the substrate of the fingerprint identification device.

Based on the same inventive concept, a further embodiment of the invention provides a driving method for a fingerprint identification device as provided by embodiments of the invention. Since the principle of the method for solving problems is similar to that of the aforesaid fingerprint identification device, reference can be made to the embodiments of the fingerprint identification device for the implementation of the method, and the repetitive details will not be described again herein.

In some embodiments, as shown in FIG. 5, the driving method for the fingerprint identification device may comprise the steps of:

S501, controlling a first switch unit in each row of fingerprint identification units of the fingerprint identification device to be turned on sequentially row by row, so as to control the fingerprint identification electrodes in each row of fingerprint identification units to be electrically connected with the signal input line and load a detection signal transmitted by the signal input line to the fingerprint identification electrode.

S502, controlling a second switch unit in each row of fingerprint identification units of the fingerprint identification device to be turned on sequentially row by row, so as to control the fingerprint identification electrodes in each row of fingerprint identification units to be electrically connected with the signal reading line, read and output an identification signal generated by the fingerprint identification electrode by means of the signal reading line.

In some embodiments, the driving method for the fingerprint identification device may further comprise controlling the second switch unit in each row of fingerprint identification units to be turned on, in the meantime controlling the first switch unit in an adjacent next row of fingerprint identification units to be turned on.

In the driving method for the fingerprint identification device provided by an embodiment of the invention, the step of controlling the second switch unit in each row of fingerprint identification units to be turned on, in the meantime controlling the first switch unit in an adjacent next row of fingerprint identification units to be turned on may comprise a step of controlling the second switch unit in each row of fingerprint identification units and the first switch unit in the adjacent next row of fingerprint identification units to be turned on simultaneously by means of a same gate line between adjacent two rows of fingerprint identification units.

Next, the operation of the fingerprint identification device provided by embodiments of the invention is to be described in detail by way of a specific example. Take the fingerprint identification device shown in FIG. 4 for example, in which the gate lines comprise gate lines $G_1, G_2 \ldots G_{n+1}$, the signal input lines comprise signal input lines $X_{1Write}, X_{2Write} \ldots X_{nWrite}$, and the signal reading lines comprise signal reading lines $X_{1Read}, X_{2Read} \ldots X_{nRead}$. The operation process of the fingerprint identification device may comprise the following stages.

Figure 7:
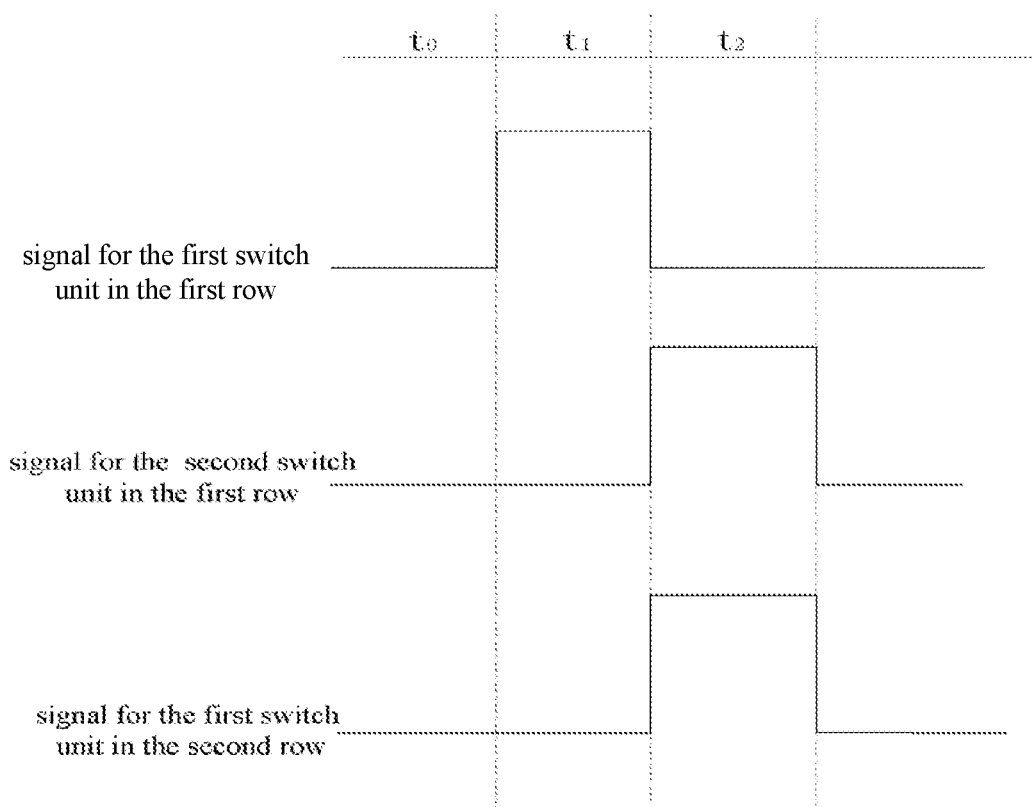
FIG. 7 is an operation time sequence chart of the fingerprint identification device as shown in FIG. 4.

A first stage: as shown in 6a, a scanning signal is applied to the gate line $G_1$, so as to turn on the first switch unit in the first row of fingerprint identification units, meanwhile, a detection signal is written into the fingerprint identification electrode in the first row of fingerprint identification units through the signal input lines $X_{1Write}, X_{2Write} \ldots X_{nWrite}$. Due to the function of capacitance coupling, the fingerprint identification electrode generates a corresponding capacitance. As shown in FIG. 7, a time period for writing this detection signal is $t_1$. The above mentioned capacitance would not be changed in case of no external influence, but when a person's finger touches the fingerprint identification device, since the fingerprint texture features the two patterns of ridges and valleys, and the distances from a ridge and from a valley to the fingerprint identification electrode are different, this would cause different influences on the capacitances generated at the fingerprint identification electrode corresponding to the positions of the ridge and the valley, resulting in different variations in capacitance. The amounts of such capacitance variations may be in one-to-one correspondence with specific coordinate positions of a two-dimensional lattice.

Figure 6A:
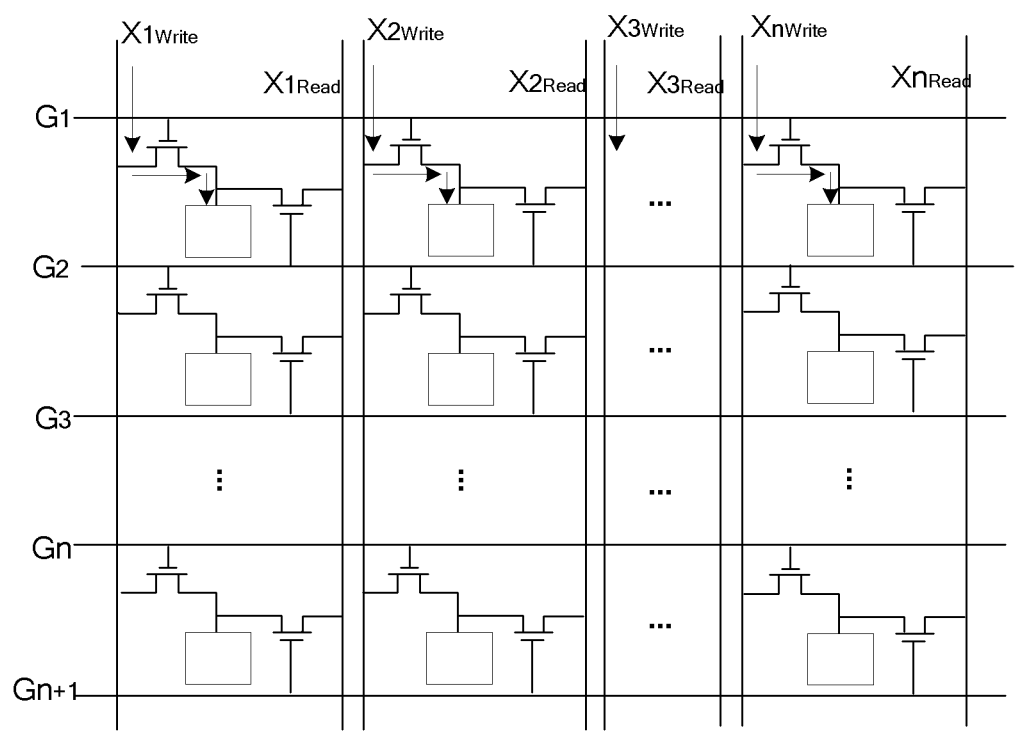
FIG. 6a and FIG. 6b respectively illustrate different operation stages for the fingerprint identification device as shown in FIG. 4.
Figure 6B:
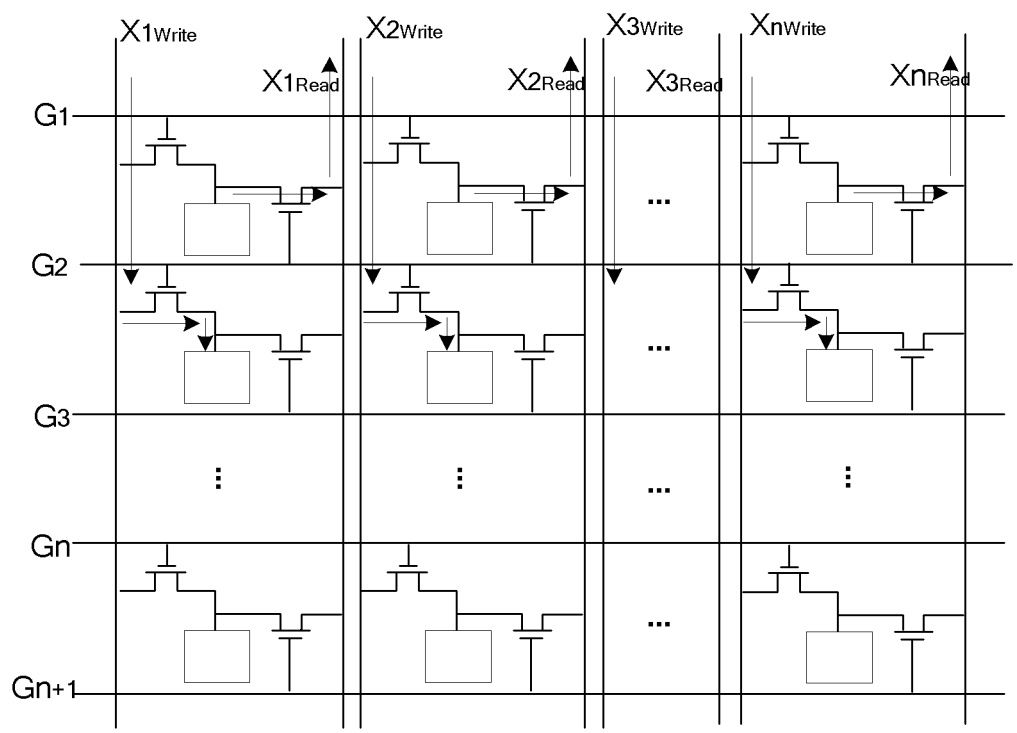

A second stage: as shown in FIG. 6b, a reverse voltage is applied to the gate line $G_1$ so that the first switch unit in the first row of fingerprint identification units is turned off, meanwhile, a scanning signal is applied to the gate line $G_2$, so as to turn on the second switch unit in the first row of fingerprint identification units and the first switch unit in the second row of fingerprint identification units. When the second switch unit in the first row of fingerprint identification units is turned on, the identification signal generated from the fingerprint identification electrode is read out through the signal reading lines $X_{1Read}, X_{2Read} \ldots X_{nRead}$, and the identification signals are transmitted to a processing chip of the fingerprint identification device for processing. As shown in FIG. 7, a time period for reading the identification signal is $t_2$. When the first switch unit in the second row of fingerprint identification units is turned on, a detection signal is written into the fingerprint identification electrodes in the second row of fingerprint identification units through the signal input lines $X_{1Write}, X_{2write} \ldots X_{nWrite}$. According to the time sequence chart shown in FIG. 7, the time period for writing this detection signal is $t_2$. It can be seen clearly from the time sequence chart of FIG. 7 that, as compared to the conventional fingerprint identification device, the time between scanning the gate line $G_1$ and the gate line $G_2$ in this fingerprint identification device is reduced by $t_2$, which demonstrates that the fingerprint identification device provided by the embodiment of the invention can reduce the scanning time, thereby increasing the scanning efficiency and improving the accuracy of identification.

A third stage: the detection signal and the identification signal are compared, so that the ridges and valleys to which each fingerprint identification unit corresponds are determined based on an amount of variation between the detection signal and the identification signal.

Then, scanning signals are applied sequentially to the gate lines $G_3, G_4 \ldots G_{n+1}$, and the first stage to the third stage are repeated until the end of the scanning.

Based on the same inventive concept, a further embodiment of the invention provides a display apparatus, which may comprise a fingerprint identification device or a display panel as provided by the above embodiments of the invention. The display apparatus may be any product or component with a display function, such as a mobile phone, a tablet computer, a television, a display, a laptop, a digital photo frame, a navigator, and so on. As for the other essential parts of the display apparatus, as can be understood by a person having an ordinary skill in the art, they are inherent and will not be described herein. They should not be taken as limitations to the invention. Reference can be made to the embodiments of the fingerprint identification device for the implementation of the display apparatus, and the repetitive details will not be described again here.

The embodiments of the invention provide a fingerprint identification device, a driving method thereof, a display panel and a display apparatus. The fingerprint identification device may comprise a plurality of fingerprint identification units arranged in a matrix, a signal input line for loading a detection signal and a signal reading line for reading an identification signal which are in one-to-one correspondence with each column of fingerprint identification units. Each fingerprint identification unit comprises a fingerprint identification electrode, a first switch unit and a second switch unit. The first switch unit is connected to the fingerprint identification electrode and the signal input line respectively, for controlling an electrical conduction between the fingerprint identification electrode and the signal input line. The second switch unit is connected to the fingerprint identification electrode and the signal reading line respectively, for controlling an electrical conduction between the fingerprint identification electrode and the signal reading line. Since the fingerprint identification device is provided with the signal input line, the signal reading line and two independent switch units in each fingerprint identification unit, it may be enabled that, by means of the first switch unit and the second switch unit, controlling the fingerprint identification units to read the identification signal sequentially row by row at the same time of loading the detection signal sequentially row by row for the fingerprint identification units. Thus, the scanning time may be reduced, the scanning efficiency may be increased and the accuracy of identification may be improved.

It is apparent that the person having an ordinary skill in the art can make various modifications and variations to the embodiments of the invention without departing from the spirit and scope of the invention. In this way, if these modifications and variations fall within the scope of the claims of the application and their equivalent technologies, the invention is intended to include these modifications and variations.

The invention claimed is:

1. A fingerprint identification device, comprising:
a plurality of fingerprint identification units arranged in a matrix;
a signal input line for loading a detection signal and a signal reading line for reading an identification signal which are in one-to-one correspondence with each column of fingerprint identification units;
wherein each fingerprint identification unit comprises a fingerprint identification electrode, a first switch unit and a second switch unit, the first switch unit is connected to the fingerprint identification electrode and the signal input line respectively for controlling an electrical conduction between the fingerprint identification electrode and the signal input line, the second switch unit is connected to the fingerprint identification electrode and the signal reading line respectively for controlling an electrical conduction between the fingerprint identification electrode and the signal reading line.

2. The fingerprint identification device according to claim 1, wherein the fingerprint identification device further comprises a first gate line connected to the first switch units in each row of fingerprint identification units, and a second gate line connected to the second switch units in each row of fingerprint identification units.

3. The fingerprint identification device according to claim 2, wherein for adjacent two rows of fingerprint identification units, the second gate line connected to the second switch units in a preceding row of fingerprint identification units and the first gate line connected to the first switch units in a following row of fingerprint identification units are located between the adjacent two rows of fingerprint identification units.

4. The fingerprint identification device according to claim 3, wherein for adjacent two rows of fingerprint identification units, the second gate line connected to the second switch units in the preceding row of fingerprint identification units and the first gate line connected to the first switch units in the following row of fingerprint identification units are a same gate line.

5. The fingerprint identification device according to claim 2, wherein the first switch unit comprises a first thin film transistor, the second switch unit comprises a second thin film transistor, a first terminal of the first thin film transistor is connected to the signal input line, a second terminal of the first thin film transistor is connected to the fingerprint identification electrode, and a gate of the first thin film transistor is connected to the first gate line,
wherein a first terminal of the second thin film transistor is connected to the fingerprint identification electrode, a second terminal of the second thin film transistor is connected to the signal reading line, and a gate of the second thin film transistor is connected to the second gate line.

6. The fingerprint identification device according to claim 1, wherein the signal input line and signal reading line are located at two sides of each column of fingerprint identification units, respectively.

7. The fingerprint identification device according to claim 1, wherein the fingerprint identification device further comprises a silicon wafer as a substrate.

8. A display panel comprising a substrate and a fingerprint identification device located on the substrate, the fingerprint identification device comprising:
a plurality of fingerprint identification units arranged in a matrix;
a signal input line for loading a detection signal and a signal reading line for reading an identification signal which are in one-to-one correspondence with each column of fingerprint identification units;
wherein each fingerprint identification unit comprises a fingerprint identification electrode, a first switch unit and a second switch unit, the first switch unit is connected to the fingerprint identification electrode and the signal input line respectively for controlling an electrical conduction between the fingerprint identification electrode and the signal input line, the second switch unit is connected to the fingerprint identification electrode and the signal reading line respectively for controlling an electrical conduction between the fingerprint identification electrode and the signal reading line.

9. The display panel according to claim 8, wherein the fingerprint identification device further comprises a first gate line connected to the first switch units in each row of fingerprint identification units, and a second gate line connected to the second switch units in each row of fingerprint identification units.

10. The display panel according to claim 9, wherein for adjacent two rows of fingerprint identification units, the second gate line connected to the second switch units in a preceding row of fingerprint identification units and the first gate line connected to the first switch units in a following row of fingerprint identification units are located between the adjacent two rows of fingerprint identification units.

11. The display panel according to claim 10, wherein for adjacent two rows of fingerprint identification units, the second gate line connected to the second switch units in the preceding row of fingerprint identification units and the first gate line connected to the first switch units in the following row of fingerprint identification units are a same gate line.

12. The display panel according to claim 9, wherein the first switch unit comprises a first thin film transistor, the second switch unit comprises a second thin film transistor, a first terminal of the first thin film transistor is connected to the signal input line, a second terminal of the first thin film transistor is connected to the fingerprint identification electrode, and a gate of the first thin film transistor is connected to the first gate line, wherein a first terminal of the second thin film transistor is connected to the fingerprint identification electrode, a second terminal of the second thin film transistor is connected to the signal reading line, and a gate of the second thin film transistor is connected to the second gate line.

13. The display panel according to claim 8, wherein the signal input line and signal reading line are located at two sides of each column of fingerprint identification units, respectively.

14. A driving method for a fingerprint identification device, comprising:

controlling a first switch unit in each row of fingerprint identification units of the fingerprint identification device to be turned on sequentially row by row, so as to control a fingerprint identification electrode in each row of fingerprint identification units to be electrically connected with a signal input line and load a detection signal transmitted by the signal input line to the fingerprint identification electrode; and controlling a second switch unit in each row of fingerprint identification units of the fingerprint identification device to be turned on sequentially row by row, so as to control the fingerprint identification electrodes in each row of fingerprint identification units to be electrically connected with a signal reading line, read and output an identification signal generated by the fingerprint identification electrode by means of the signal reading line.

15. The driving method according to claim 14, wherein the method further comprises controlling the second switch unit in each row of fingerprint identification units to be turned on, in the meantime controlling the first switch unit in an adjacent next row of fingerprint identification units to be turned on.

16. The driving method according to claim 15, wherein the step of controlling the second switch unit in each row of fingerprint identification units to be turned on, in the meantime controlling the first switch unit in an adjacent next row of fingerprint identification units to be turned on comprises: controlling the second switch unit in each row of fingerprint identification units and the first switch unit in the adjacent next row of fingerprint identification units to be turned on simultaneously by means of a same gate line between adjacent two rows of fingerprint identification units.

* * * * *